US 6,563,118 B2

(12) United States Patent
Ooms et al.

(10) Patent No.: US 6,563,118 B2
(45) Date of Patent: May 13, 2003

(54) PYROELECTRIC DEVICE ON A MONOCRYSTALLINE SEMICONDUCTOR SUBSTRATE AND PROCESS FOR FABRICATING SAME

(75) Inventors: William J. Ooms, Prescott, AZ (US); Jeffrey M. Finder, Chandler, AZ (US); Kurt W. Eisenbeiser, Tempe, AZ (US); Jerald A. Hallmark, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/733,181

(22) Filed: Dec. 8, 2000

(65) Prior Publication Data

US 2002/0072245 A1 Jun. 13, 2002

(51) Int. Cl.[7] ............................. G01J 5/00; H01L 29/06
(52) U.S. Cl. ...................... 250/338.3; 257/43; 257/467; 257/613
(58) Field of Search .................. 257/43, 467, 532, 257/613; 250/338.3

(56) References Cited

U.S. PATENT DOCUMENTS

| | | |
|---|---|---|
| 3,766,370 A | 10/1973 | Walther |
| 3,802,967 A | 4/1974 | Ladany et al. |
| 4,006,989 A | 2/1977 | Andringa |
| 4,174,422 A | 11/1979 | Matthews et al. |
| 4,284,329 A | 8/1981 | Smith et al. |
| 4,404,265 A | 9/1983 | Manasevit |
| 4,482,906 A | 11/1984 | Hovel et al. |
| 4,484,332 A | 11/1984 | Hawrylo |

(List continued on next page.)

FOREIGN PATENT DOCUMENTS

| | | |
|---|---|---|
| EP | 0 250 171 | 12/1987 |
| EP | 0 342 937 | 11/1989 |
| EP | 0 455 526 | 6/1991 |
| EP | 0 514 018 | 11/1992 |
| EP | 0 602 568 | 6/1994 |
| EP | 0 607 435 | 7/1994 |
| EP | 0 999 600 | 5/2000 |
| EP | 1 001 468 | 5/2000 |

(List continued on next page.)

OTHER PUBLICATIONS

Nakagawara et al., Effects of Buffer Layers in Epitaxial Growth of $SrTiO_3$ Thin Film on Si(100), *J. Appl. Phys.*, 78(12), Dec. 15, 1995, pp. 7226–7230.

Suzuki et al., "A Proposal of Epitaxial Oxide Thin Film Structures For Future Oxide Electronics," *Materials Science and Engineering B41,* (1996), pp. 166–173.

W. F. Egelhoff et al., "Optimizing GMR Spin Valves: The Outlook for Improved Properties", *1998 Int'l Non Volatile Memory Technology Conference,* pp. 34–37.

Wang et al., "Processing and Performance of Piezoelectric Films", Univ. Of MD, Wilcoxon Research Col, and Motorola Labs, May 11, 2000.

(List continued on next page.)

*Primary Examiner*—Richard Booth
(74) *Attorney, Agent, or Firm*—Oblon, Spivak, McClelland, Maier & Neustadt, P.C.

(57) ABSTRACT

High quality epitaxial layers of monocrystalline materials can be grown overlying large silicon wafers by first growing an accommodating buffer layer (104) on a silicon wafer (102). The accommodating buffer layer (104) is a layer of monocrystalline material spaced apart from the silicon wafer (102) by an amorphous interface layer (108) of silicon oxide. The amorphous interface layer dissipates strain and permits the growth of a high quality monocrystalline accommodating buffer layer. Any lattice mismatch between the accommodating buffer layer and the underlying silicon substrate is taken care of by the amorphous interface layer. Utilizing this technique permits the fabrication of thin film pyroelectric devices (150) on a monocrystalline silicon substrate.

6 Claims, 2 Drawing Sheets

U.S. PATENT DOCUMENTS

| | | |
|---|---|---|
| 4,523,211 A | 6/1985 | Morimoto et al. |
| 4,661,176 A | 4/1987 | Manasevit |
| 4,777,613 A | 10/1988 | Shahan et al. |
| 4,793,872 A | 12/1988 | Meunier et al. |
| 4,802,182 A | 1/1989 | Thornton et al. |
| 4,815,084 A | 3/1989 | Scifres et al. |
| 4,846,926 A | 7/1989 | Kay et al. |
| 4,855,249 A | 8/1989 | Akasaki et al. |
| 4,876,219 A | 10/1989 | Eshita et al. |
| 4,882,300 A | 11/1989 | Inoue et al. |
| 4,891,091 A | 1/1990 | Shastry |
| 4,896,194 A | 1/1990 | Suzuki |
| 4,912,087 A | 3/1990 | Aslam et al. |
| 4,928,154 A | 5/1990 | Umeno et al. |
| 4,963,508 A | 10/1990 | Umeno et al. |
| 4,963,949 A | 10/1990 | Wanlass et al. |
| 4,999,842 A | 3/1991 | Huang et al. |
| 5,060,031 A | 10/1991 | Abrokwah et al. |
| 5,063,166 A | 11/1991 | Mooney et al. |
| 5,081,062 A | 1/1992 | Vasudev et al. |
| 5,116,461 A | 5/1992 | Lebby et al. |
| 5,127,067 A | 6/1992 | Delcoco et al. |
| 5,141,894 A | 8/1992 | Bisaro et al. |
| 5,144,409 A | 9/1992 | Ma |
| 5,155,658 A | 10/1992 | Inam et al. |
| 5,159,413 A | 10/1992 | Calviello et al. |
| 5,173,474 A | 12/1992 | Connell et al. |
| 5,221,367 A | 6/1993 | Chisholm et al. |
| 5,225,031 A | 7/1993 | McKee et al. |
| 5,248,564 A * | 9/1993 | Ramesh ............... 428/688 |
| 5,270,298 A | 12/1993 | Ramesh |
| 5,286,985 A | 2/1994 | Taddiken |
| 5,293,050 A | 3/1994 | Chapple-Sokol et al. |
| 5,310,707 A | 5/1994 | Oishi et al. |
| 5,326,721 A | 7/1994 | Summerfelt |
| 5,356,831 A | 10/1994 | Calviello et al. |
| 5,358,925 A | 10/1994 | Connell et al. |
| 5,391,515 A | 2/1995 | Kao et al. |
| 5,393,352 A | 2/1995 | Summerfelt |
| 5,404,581 A | 4/1995 | Honjo |
| 5,418,216 A | 5/1995 | Fork |
| 5,418,389 A | 5/1995 | Watanabe |
| 5,436,759 A | 7/1995 | Dijaii et al. |
| 5,442,191 A | 8/1995 | Ma |
| 5,444,016 A | 8/1995 | Abrokwah et al. |
| 5,450,812 A | 9/1995 | McKee et al. |
| 5,478,653 A | 12/1995 | Guenzer |
| 5,480,829 A | 1/1996 | Abrokwah et al. |
| 5,482,003 A | 1/1996 | McKee et al. |
| 5,514,484 A | 5/1996 | Nashimoto |
| 5,528,414 A | 6/1996 | Oakley |
| 5,556,463 A | 9/1996 | Guenzer |
| 5,576,879 A | 11/1996 | Nashimoto |
| 5,588,995 A | 12/1996 | Sheldon |
| 5,606,184 A | 2/1997 | Abrokwah et al. |
| 5,614,739 A | 3/1997 | Abrokwah et al. |
| 5,640,267 A | 6/1997 | May et al. |
| 5,670,798 A | 9/1997 | Schetzina |
| 5,674,366 A | 10/1997 | Hayashi et al. |
| 5,729,394 A | 3/1998 | Sevier et al. |
| 5,729,641 A | 3/1998 | Chandonnet et al. |
| 5,731,220 A | 3/1998 | Tsu et al. |
| 5,733,641 A | 3/1998 | Fork et al. |
| 5,735,949 A | 4/1998 | Mantl et al. |
| 5,741,724 A | 4/1998 | Ramdani et al. |
| 5,764,676 A | 6/1998 | Paoli et al. |
| 5,777,762 A | 7/1998 | Yamamoto |
| 5,778,018 A | 7/1998 | Yoshikawa et al. |
| 5,778,116 A | 7/1998 | Tomich |
| 5,790,583 A | 8/1998 | Ho |
| 5,801,105 A | 9/1998 | Yano et al. .................. 438/785 |
| 5,810,923 A | 9/1998 | Yano et al. |
| 5,825,799 A | 10/1998 | Ho et al. |
| 5,828,080 A | 10/1998 | Yano et al. |
| 5,830,270 A | 11/1998 | McKee et al. |
| 5,857,049 A | 1/1999 | Beranek et al. |
| 5,858,814 A | 1/1999 | Goossen et al. |
| 5,861,966 A | 1/1999 | Ortel |
| 5,874,860 A | 2/1999 | Brunel et al. |
| 5,883,996 A | 3/1999 | Knapp et al. |
| 5,912,068 A | 6/1999 | Jia |
| 5,926,496 A | 7/1999 | Ho et al. |
| 5,937,285 A | 8/1999 | Abrokwah et al. |
| 5,981,400 A | 11/1999 | Lo |
| 5,990,495 A | 11/1999 | Ohba |
| 5,995,359 A | 11/1999 | Klee et al. |
| 6,002,375 A | 12/1999 | Corman et al. |
| 6,008,762 A | 12/1999 | Nghiem |
| 6,020,222 A | 2/2000 | Wollesen |
| 6,045,626 A | 4/2000 | Yano et al. |
| 6,055,179 A | 4/2000 | Koganei et al. |
| 6,058,131 A | 5/2000 | Pan |
| 6,064,078 A | 5/2000 | Northrup et al. |
| 6,064,092 A | 5/2000 | Park |
| 6,096,584 A | 8/2000 | Ellis-Monaghan et al. |
| 6,103,008 A * | 8/2000 | McKee et al. .................. 117/2 |
| 6,107,653 A | 8/2000 | Fitzgerald |
| 6,113,690 A | 9/2000 | Yu et al. |
| 6,114,996 A | 9/2000 | Nghiem |
| 6,121,642 A | 9/2000 | Newns |
| 6,128,178 A | 10/2000 | Newns |
| 6,136,666 A | 10/2000 | So |
| 6,137,603 A | 10/2000 | Henmi |
| 6,143,072 A | 11/2000 | McKee et al. |
| 6,146,906 A | 11/2000 | Inoue et al. |
| 6,173,474 B1 | 1/2001 | Conrad |
| 6,174,755 B1 | 1/2001 | Manning |
| 6,180,252 B1 | 1/2001 | Farrell et al. |
| 6,180,486 B1 | 1/2001 | Leobandung et al. |
| 6,184,144 B1 | 2/2001 | Lo |
| 6,222,654 B1 | 4/2001 | Frigo |
| 6,392,257 B1 * | 5/2002 | Ramdani et al. ............. 257/190 |

FOREIGN PATENT DOCUMENTS

| | | | |
|---|---|---|---|
| GB | 1 319 311 | 6/1970 | |
| GB | 2 335 792 | 9/1999 | |
| JP | 52-88354 | 7/1977 | |
| JP | 54-134554 | 10/1979 | |
| JP | 55-87424 | 7/1980 | |
| JP | 61-108187 | 5/1986 | |
| JP | 63-34994 | 2/1988 | |
| JP | 63-131104 | 6/1988 | |
| JP | 63-198365 | 8/1988 | |
| JP | HEI 2-391 | 1/1990 | |
| JP | 63-278629 | 1/1990 | |
| JP | 5-48072 | 2/1993 | |
| JP | 6-232126 | 8/1994 | |
| JP | 6-291299 | 10/1994 | |
| JP | 6-33 4168 | 12/1994 | |
| JP | 10-321943 | 12/1998 | |
| JP | 11-238683 | 8/1999 | |
| JP | 11-260835 | 9/1999 | |
| WO | WO 97/45827 | 12/1997 | |
| WO | WO 99/14797 | 3/1999 | |
| WO | WO 99/14804 | 3/1999 | |
| WO | 9914804 | 3/1999 | ......... H01L/21/258 |
| WO | WO 99/19546 | 4/1999 | |
| WO | WO 99/63580 | 12/1999 | |
| WO | WO 00/33363 | 6/2000 | |
| WO | WO 00/48239 | 8/2000 | |

OTHER PUBLICATIONS

M. Rotter et al., "Nonlinear Acoustoelectric Interactions in GaAs/LiNbO$_3$ Structures", *Applied Physics Letters,* vol. 75(7), Aug. 16, 1999, pp. 965–967.

K. Sreenivas et al., "Surface Acoustic Wave Propagation on Lead Zirconate Titanate Thin Films," *Appl. Phys. Lett.* 52 (9), Feb. 29, 1998, pp. 709–711.

M. Rotter et al., "Single Chip Fused Hybrids for Acousto–Electric and Acousto–Optic Applications," *1997 Applied Physics Letters,* vol. 70(16), Apr. 21, 1997, pp. 2097–2099.

A. Mansingh et al., "Surface Acoustic Wave Propagation in PZT/YBCO/SrTiO$_3$ and PbTiO$_3$/YBCO/SrTiO$_3$ Epitaxial Heterostructures," *Ferroelectric,* vol. 224, pp. 275–282, 1999.

S. Mathews et al., "Ferroelectric Field Effect Transisitor Based on Epitaxial Perovskite Heterostructures", Science, vol. 276, Apr. 11, 1997, pp. 238–240.

R. Houdre et al., "Properties of GaAs on Si Grown by Molecular Beam Epitaxy," *Solid State and Materials Sciences,* vol. 16, Issue 2, 1990, pp. 91–114.

S. F. Fang et al., "Gallium Arsenide and Other Compound Semiconductors on Silicon," *J. Appl. Phys.,* 68(7), Oct. 1, 1990, pp. R31–R58.

Carlin et al., Impact of GaAs Buffer Thickness on Electronic Quality of GaAs Grown on Graded Ge/GeSi/Si Substrates, *Appl. Phys. Letter,* vol. 76, No. 14, Apr. 2000, pp. 1884–1886.

Ringel et al., "Epitaxial Integration of III–V Materials and Devices with Si Using Graded GeSi Buffers," 27$^{th}$ International Symposium on Compound Semiconductors, Oct. 2000.

Zogg et al., "Progress in Compound–Semiconductor–on–Silicon–Heteroepitaxy with Fluoride Buffer Layers," *J. Electrochem Soc.,* vol. 136, No. 3, Mar. 1998, pp. 775–779.

Xiong et al., "Oxide Defined GaAs Vertical–Cavity Surface–Emitting Lasers on Si Substrates," *IEEE Photonics Technology Letters,* vol. 12, No. 2, Feb. 2000, pp. 110–112.

Clem et al., "Investigation of PZT//LSCO//Pt//Aerogel Thin Film Composites for Uncooled Pyroelectric IR Detectors," *Mat. Res. Soc. Symp. Proc.,* vol. 541, pp. 661–666, 1999.

Gunapala et al., "Bound–To–Quasi–Bound Quantum–Well Infrared Photodetectors," NASA Tech Brief, vol. 22, No. 9, Sep. 1998.

Brown et al., "Photodetectors: Materials and Devices II," *Intn. Society for Optical Engineering,* vol. 2999, pp. 211–224.

Bruley et al., "Nanostructure and Chemistry of a (100)MgO/(100) GaAs Interface," *Appl. Phys Lett,* 65(5), Aug. 1994, pp. 564–566.

Fork et al., "Epitaxial MgO On Si(001) for Y–Ba–Cu–O Thin Film Growth by Pulsed Laser Deposition," *Appl. Phys Lett.,* 58(20), May 20, 1991, pp. 2294–2296.

Himpsel et al., "Dialectrics on Semiconductors," *Materials Science and Engineering,* B1(1988), pp. 9–13.

Li et al., "Epitaxial La$_{0.67}$Sr$_{0.33}$MnO$_3$ Magnetic Tunnel Junctions," *J. Appl. Phys.* 81(8), Apr. 15, 1997, pp. 5509–5511.

O'Donnell et al., "Colossal Magnetoresistance Magnetic Tunnel Junctions Grown by Molecular–Beam Epitaxy," *Appl. Physics Letters,* vol. 76, No. 14, Apr. 3, 2000, pp. 1914–1916.

Mikami et al., "Formation of Si Epi/MgO–AI$_2$O$_3$Epi./SiO$_3$/Si and Its Epitaxial Film Quality," Fundamental Research Laboratories and Microelectronics Laboratories, pp. 31–34, 1983.

T. Asano et al., "An Epitaxial Si/Insulator/Si Structure Prepared by Vacuum Deposition of CaF$_2$ and Silicon," *Thin Solid Films,* vol. 93 (1982), pp. 143–150.

T. Chikyow et al., "Reaction and Regrowth Control of CeO$_2$ on Si(111) Surface for the Silicon–On–Insulator Structure," *Appl. Phys. Lett.,* vol. 65, No. 8, Aug. 22, 1994, pp. 1030–1032.

J.F. Kang, et al., "Epitaxial Growth of CeO$_2$(100) Films on Si(100) Substrates by Dual Ion Beams Reactive Sputtering," *Solid State Communications,* vol. 108, No. 4, pp. 225–227, 1998.

R.A. Morgan et al., "Vertical–Cavity Surface–Emitting Lasers Come of Age," SPIE, vol. 2683, pp. 18–29.

"Technical Analysis of Qualcomm QCP–800 Portable Cellular Phone (Transmitter Circuitry)," Talus Corporation, Qualcomm QCP–800 Technical Analysis Report, Dec. 10, 1996, pp. 5–8.

Jo–Ey Wong, et al.; "An Electrostatically–Actuated MEMS Switch for Power Applications"; IEEE, 2000; pp. 633–638.

T. Mizuno, et al.; "Electron and Hole Mobility Enhancement in Strained–Si MOSFET's on SiGe–on–Insulator Substrates Fabricated by SIMOX Technology"; IEEE Electron Device Letters, vol. 21. No. 5, May 2000; pp. 230–232.

F.M. Buffer, et al.; "Strain–dependence of electron transport in bulk Si and deep–submicron MOSFET's" Computatural Electronics, 2000, Book of Abstracts, IWCE Glasgow 2000, 7$^{th}$ Int'l Workshop on, 2000; pp. 64–65.

S.S. Lu, et al.; "Piezoelectric field effect transistor (PEFET) using In$_{0.2}$Ga$_{0.8}$As/Al$_{0.35}$Ga$_{0.65}$As/In$_{0.2}$Ga$_{0.8}$As/GaAs Strained layer structure on (111)B GaAs substrate"; Electronics Letters, 12$^{th}$ Ma 1994, vol. 30, No. 10; pp. 823–825.

Kihong Kim, et al."On–Chip Wireless Interconnection with Integrated Antennas"; 2000 IEEE; pp. 20.2.1–20.3.4.

G. Passioupoulos, et al.; "V–Band Single Chip, Direct Carrier BPSK Modulation Transmitter with Integrated Patch Antenna"; 1998 IEEE MTT–S Digest; pp. 305–308.

Mau–Chung Frank Chang, et al.; "RF/Wireless Interconnect for Inter– and Intra–Chip Communications"; Proceedings of the IEEE, vol. 89, No. 4, Apr. 2001; pp. 456–466.

The Electronics Industry Report; Prismark; 2001; pp. 111–120.

J.K. Abrokwah, et al.; "A Manufacturable Complementary GaAs Process"; GaAs IC Symposium, IEEE, 1993; pp. 127–130.

H. Nagata, "A Preliminary Consideration of the Growth Behaviour of CeO$_2$, SrTiO$_3$ and SrVO$_3$ Films on Si Substrate," *Thin Solid Films,* 224, 1993, pp. 1–3.

Nagata et al., "Heteroepitaxial Growth of CeO$_2$(001) Films on Si(001) Substrates by Pulsed Laser Deposition in Ultrahigh Vacuum," *Jpn. Jour. Appl. Phys.,* vol. 30, No. 6B, Jun. 1991, pp. L1136–L1138.

Kado et al., "Heteroepitaxial Growth of SrO Films on Si Substrates," *J. Appl. Phys.,* 61(6), Mar. 15, 1987, pp. 2398–2400.

Bean et al., "Silicon Molecular Beam Epitaxy," *Materials Research Symposium Proceedings,* vol. 220, pp. 595–600, Apr. 29–May 3, 1991.

J.K. Abrokwah, et al.; "A Manufacturable High–Speed Low– Power Complementary GaAs Process"; Extended Abstracts of the 1994 International Conference on Solid State Devices and Materials, Yokohama, 1994, pp. 592–594.

Leonard J. Brillson; "Stable and Epitaxial Contacts to III–V Compound Semiconductors", Semiconductors Fundamentals and Technology; Noyles Publications, 1993; pp. 67–150.

Jayshri Sabarinathat, et al.; "Submicron three–dimensional infrared GaAs/Al$_x$O$_y$–based photonic crystal using single–step epitaxial growth"; Applied Physics Letters, vol. 78, No. 20, May 14, 2001; pp. 3024–3026.

Philip Ball; "The Next Generation of Optical Fibert"; Technology Review, May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51–96.

G. H. Jin, et al.; "PLZT Film Waveguide Mach–Zehnder Electrooptic Modulator"; Journal of Lightwave Technology, vol. 18, No. 6. Jun. 2000; pp. 807–812.

D.E. Aspnes, et al.; "Steps on (001) silicon surfaces"; J. Vac. Sci. Technol. B, vol. 5, No. 4, Jul./Aug. 1987; pp. 939–944.

D.M. Newns, et al.; "Mott transition field effect transistor"; Applied Physics Letters, vol. 73, No. 6, Aug. 10, 1998; pp. 780–782.

Lucent Technologies, Inc. "Arrayed Waveguide Grating Multiplexer/Demultiplexer"; Jan. 2000; 4 pages.

Hisashi Shichijo, et al.; "Co–Integration of GaAs MESFET and Si CMOS Circuits"; IEEE Electron Device Letters, vol. 9, No. 9, Sep. 1988; pp. 444–446.

H. Shichijo, et al.; "GaAs MESFET and Si CMOS Cointegration and Circuit Techniques"; 1988 IEEE; GaAs IC Symposium—239–242.

H. Shichijo, et al.; "Monolithic Process for Co–Integration of GaAs and Silicon Circuits"; 1988 IEEE; pp. 778–781.

Z.H. Zhu, et al. "Growth of InGaAs Multi–quantum wells at 1.3$\mu$m wavelength on GaAs compliant substrates"; Applied Physics Letters, vol. 72, No. 20, May 18, 1998; pp. 2598–2600.

Kurt Eisenbeiser, et al.; "Metamorphic InAlAs/InGaAs Enhancement Mode HEMT's on GaAs Substrates"; IEEE Electron Device Letters, vol. 20, No. 10, Oct. 1999; pp. 507–509.

Tomonori Nagashima, et al.; "Three–Terminal Tandem Solar Cells With a Back–Contact Type Bottom Cell" Higashifuji Technical Center, Toyota Motor Corporation; 4 pages, 2000.

James Schellenberg, et al.; "Low–Loss, Planar Monolithic Baluns for K/Ka–Band Applications"; 1999 IEEE MTT–S Digest; pp. 1733–1736.

Patent Abstracts of Japan, vol. 010, No. 289, Oct. 2, 1986 & JP 61 108187, May 26, 1986.

Patent Abstracts of Japan, vol. 017, No. 344 & JP 05 048072, Feb. 26, 1993.

Patent Abstracts of Japan, vol. 1999, No. 14, Dec. 22, 1999 & JP 11 260835, Sep. 24, 1999.

Patent Abstracts of Japan, vol. 012, No. 388, Oct. 17, 1988 & JP 63 131104, Jun. 3, 1988.

Patent Abstracts of Japan, vol. 012, No. 246, Jul. 12, 1988 & JP 63 034994, Feb. 15, 1988.

Patent Abstracts of Japan, vol. 012, No. 77, Mar. 10, 1988 & JP 62 216600, Sep. 24, 1987.

R.D. Vispute; "High quality optoelectronic grade epitaxial AlN films on $\alpha$–Al$_2$O$_3$, Si and 6H–SiC by pulsed laser deposition"; Thin Solid Films 299 (1997), pp. 94–103.

T. Warren Weeks, et al.; "GaN thin films deposited via organometallic vapor phase epitaxy on $\alpha$(6H)–SiC(0001) using high–temperature monocrystalline AlN buffer layers" 320 Applied Physics Letters, vol. 67, No. 3, Jul. 17, 1995, pp1401–403.

Z. Yu, et al.; "Epitaxial oxide thin films on SI(001)*"; J. Vac. Sci. Technol. B. vol. 18, No. 4, Jul./Aug. 2000; pp. 2139–2145.

Patent Abstracts of Japan, vol. 015, No. 098, Mar. 8, 1991 & JP 02 306680. Dec. 20, 1990.

Peter S. Guilfoyle, et al.; "Optoelectronic Architecture for High–Speed Switching and Processing Applications"; 1998 The Photonics Design and Applications Handbook; pp. H–399–H–406.

Antonio Mecozzi, et al.; "The Roles of Semiconductor Optical Amplifiers in Optical Networks"; Optics & Photonics News; Mar. 2001; pp. 37–42.

D.A. Francis, et al.; "A single–chip linear optical amplifier"; OFC, 2001; Mar. 17–22, 2001.

"Integration of GaAs on Si Using a Spinel Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, p. 655–656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of SrTiO$_3$ Films on Silicon Substrates," *Japan J of Appl. Phys.*, vol. 33, Mar. 1994, pp. 1472–1477.

Yodo et al., GaAs Heteroepitaxial Growth on Si Substrates with Thin Si Interlayers in situ Annealed at High Temperatures, *8257b Journal of Vacuum Science & Technology*, 1995 May/Jun., vol. 13, No. 3, pp. 1000–1005.

Cuomo et al., "Substrate Effect on the Superconductivity of YBa$_2$Cu$_3$O$_7$ Thin Films," AIP Conference 1988, pp. 141–148.

McKee et al., "Crystalline Oxides on Silicon: The First Five Monolayers," *Physical Review Letters*, vol. 81, No. 14, Oct. 1998, pp. 3014–3017.

McKee et al., "Molecular Beam Epitaxy Growth of Epitaxial Barium Silicide, Barium Oxide, and Barium Titanate on Silicon," *1991 American Institute of Physics*, pp. 782–784, Aug. 13, 1991.

Tambo et al., Molecular Beam Epitaxy Growth of SrTiO$_3$ Films on Si(100)–2x1 with SrO Buffer Layer, *Jpn. J. Appl. Phys.*, vol. 37, 1998, pp. 4454–4459.

McKee et al., "The MBE Growth and Optical Quality of BaTiO$_3$ and SrTiO$_3$ Thin Films on MgO," *Mat. Res. Soc. Symp. Proc.*, vol. 341, Apr. 1994, pp. 309–314.

McKee et al., "BaSi$_2$ and Thin Film Alkaline Earth Silicides on Silicon," *Appl. Phys. Lett.*, 63 (20), Nov. 1993, pp. 2818–2820.

McKee et al., "Surface Structures and the Orthorhombic Transformation of Thin Film BaSi$_2$ on Silicon," *Mat. Res. Soc. Symp. Proc.*, vol. 221, pp. 131–136.

Brian A. Floyd, et al.; "The projected Power Consumption of a Wireless Clock Distribution System and Comparison to Conventional Distribution Systems"; IEEE, 1999; pp. IITC99–249–IITC99–250.

Mori et al., "Epitaxial Growth of SrTiO$_3$ Films on Si(100) Substrates Using a Focused Electron Beam Evaporation Method," *Jpn. J. of Apl. Phys.,* vol. 30, No. 8A, Aug. 1991, pp. L1415–L1417.

Moon et al., "Growth of Crystalline SrTiO$_3$ Films on Si Substrates Using Thin Fluoride Buffer Layers and Their Electrical Properties," *Jpn. J. of Appl. Phys.,* vol. 33, (1994), pp. 5911–5916.

Farrow et al., "Heteroepitaxy of Dissimilar Materials," *Mat. Res. Soc. Symposium Proceedings,* vol. 221, pp. 29–34, Apr. 29–May 2, 1991.

Choi et al., "Heteroepitaxy on Silicon: Fundamentals, Structure, and Devices," *Mat. Res. Soc.,* Symposium Proceedings, vol. 116, pp. 369–374, Apr. 5–8, 1988.

Douglas B. Chrisey, et al; Pulsed Laser Deposition of Thin Films; pp. 273–285, date unknown.

B.A. Block, et al; "Photoluminescence properties of Er$^3$–doped BaTiO$_3$ thin films"; Appl. Phys. Lett. 65 (1), Jul. 4, 1994, pp. 25–27.

Gentex Corporate Website; Photoelectric Smoke Detectors—How They Work; 2001.

Jeffrey B. Casady, et al.; "A Hybrid 6H–SiC Temperature Sensor Operational from 25° C to 500° C"; IEEE Transactions on Components, Packaging, and Manufacturing Technology—Part A, vol. 19, No. 3, Sep. 1996; pp. 416–422.

Ronald W. Waynant, et al.; "Optoelectronic Integrated Circuits"; Electro–Optics Handbook, McGraw–Hill, Inc., 1994; Chapter Twenty Seven.

"Formation of Si Epi./MgO–Al$_2$O$_3$ Epi./SiO$_3$/Si and Its Epitaxial Film Quality," Masao Mikami et al., Fundamental Research Laboratories and Microelectronics Laboratories, pp. 31–34.

"An Epitaxial Si/Insulator/Si Structure Prepared by Vacuum Deposition of CaF$_2$ and Silicon," T. Asano et al., Graduate School of Science and Engineering, Tokyo Institute of Technology, pp. 143–151.

"Reaction and Regrowth Control of CeO$_2$ on Si(111) Surface for the Silicon–On–Insulator Structure," T. Chikyow et al., Appl. Phys. Lett. 65(8), Aug. 22, 1994, pp. 1030–1032.

"Epitaxial Growth of CeO$_2$(100) Films on Si(100) Substrates by Dual Ion Beams Reactive Sputtering," J.F. Kang et al., Solid State Communications, vol. 108, No. 4, pp. 225–227.

"Vertical–Cavity Surface–Emitting Lasers Come of Age," Robert A. Morgan et al., SPIE, vol. 2683, pp. 18–29.

"Technical Analysis of Qualcomm QCP–800 Portable Cellular Phone(Transmitter Circuitry)," Talus Corporation, Qualcomm QCP–800 Technical Analysis Report, Dec. 10, 1996, pp. 5–8.

"Properties of GaAs Si Grown by Molecular Beam Epitaxy, "R. Houdre et al., Solid State and Molecular Sciences, 1990, pp. 91–114.

"Gallium Arsenide and Other Compound Semiconductors on Silicon," S.F. Fang et al., J. Appl. Phys. 68(7), Oct. 1, 1990, pp. R31–R58.

"Optimizing GMR Spin Valves: The Outlook for Improved Properties", W. F. Englhoff et al., 1998 Int'l NonVolatile Memory Technology Conference, pp. 34–37.

"Processing and Performance of Piezoelectric Films", Y. Wang et al., Univ. of MD, Wilcoxon Research Co., and Motorola Labs.

"Nonlinear acoustoelectric interactions in GaAs/LiNbO$_3$ structures", M. Rotter et al., 1999 American Institute of Physics, pp. 965–967.

"Surface acoustic wave propagation on lead zirconate titanate thin films", K. Sreenivas et al., App. Phys. Lett. 52(9), Feb. 29, 1988, pp. 709–711.

"Single Chip fused hybrids for acousto–electric and acous-to–optic applications", M. Rotter et al., 1997 American Institute of Physics, pp. 2097–2099.

"Surface Acoustic Wave Propagation in PZT/YBCO/SrTiO$_3$ and PbTi O$_3$/YBCO/SrTiO$_3$ Epitaxial Heterostructures", Dept. of Physics & Astrophysics, Univ. of Delhi, pp. 275–283.

"Ferroelectric Field Effect Transisitor Based on Epitaxial Perovskite Heterostructures", S. Mathews et al., American Association for the Advancement of Science, 1997, pp. 238–240.

* cited by examiner

PYROELECTRIC DEVICE ON A MONOCRYSTALLINE SEMICONDUCTOR SUBSTRATE AND PROCESS FOR FABRICATING SAME

FIELD OF THE INVENTION

This invention relates generally to semiconductor structures and devices and to a method for their fabrication, and more specifically to pyroelectric devices and integrated circuits fabricated on a monocrystalline material.

BACKGROUND OF THE INVENTION

Various metallic oxides, such as perovskites, exhibit desirable characteristics such as piezoelectric, pyroelectric, ferroelectric, ferromagnetic, colossal magnetic resistance, and super conductivity properties. Such oxides may be included or used in connection with microelectronic devices that take advantage of these characteristics. For example, metallic oxides may be used to form pyroelectric imaging devices and the like.

For many years attempts have been made to grow thin films of various metallic oxide materials on a foreign substrate because of the desirable characteristics of the metallic oxide materials, and because of their present generally high cost and low availability in bulk form. To achieve optimal characteristics of metallic oxide material, however, a monocrystalline film of high crystalline quality is desired. Attempts have been made, for example, to grow layers of a monocrystalline metallic oxide material on substrates such as silicon. These attempts have generally been unsuccessful because lattice mismatches between the host crystal and the grown crystal have caused the resulting thin film of metallic oxide material to be of low crystalline quality. Metallic oxides of higher quality have been grown over oxide substrates such as bulk strontium titanate. Metallic oxides grown over oxide substrates are often expensive because, in part, the oxide substrate is small and expensive.

If a large area thin film of high quality monocrystalline metallic oxide material was available at low cost, a variety of semiconductor devices could advantageously be fabricated using that film at a low cost compared to the cost of fabricating such devices on a bulk wafer of the metallic oxide material or in an epitaxial film of such material on a bulk wafer of oxide material. In addition, if a thin film of high quality monocrystalline metallic oxide material could be realized on a bulk wafer such as a silicon wafer, an integrated device structure could be achieved that took advantage of the best properties of both the silicon and the metallic oxide material.

Several perovskite thin films are known to have at room temperature pyroelectric properties that are suitable for infrared detection devices. Pyroelectric detectors are designed to absorb infrared radiation that gives rise to a temperature increase which causes a change in the polarization of the pyroelectric materials. The change in polarization results in current production that can be detected by an integrated circuit. Critical factors for selecting a pyroelectric detector include pyroelectric current and response time. The sensitivity of a pyroelectric detector is primarily dependent on the magnitude of the pyroelectric coefficient, p, according to the equation:

$$I = pA\Delta T/\Delta t$$

where I is the current produced by the pyroelectric device, A is the area of the pyroelectric device, $\Delta T$ is the change in temperature detected by the pyroelectric device and $\Delta t$ is the change in time of a given measurement. The magnitude of the pyroelectric coefficient p is dependent on the crystalline quality of the pyroelectric materials. Monocrystalline films have a higher pyroelectric coefficient compared to polycrystalline films. Thus, the sensitivity of the temperature detection may increase and the device area may decrease while still maintaining the same sensitivity level.

Sandia National Laboratories has successfully integrated a polycrystalline $Pb(Zr, Ti)O_3$ pyroelectric thin film into a CMOS architecture using an aerogel thermal isolation layer. See "Investigation of PZT//LSCO//Pt//Aerogel Thin Film Composites For Uncooled Pyroelectric IR Detectors," Mat. Res. Soc. Symp., Vol. 541, pg. 661 (1999). However, the integration of monocrystalline pyroelectric thin films using PZT, $Pb(Se, Ta)O_3$ and other perovskite films on a substrate, has not been obtained.

Accordingly, a need exists for a pyroelectric detection device formed using a thin film of high quality monocrystalline oxide material formed on a bulk wafer. A need further exists for a thin film perovskite pyroelectric detection device that is monolithically integrated with a CMOS device on a monocrystalline substrate and that does not require cooling to operate.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
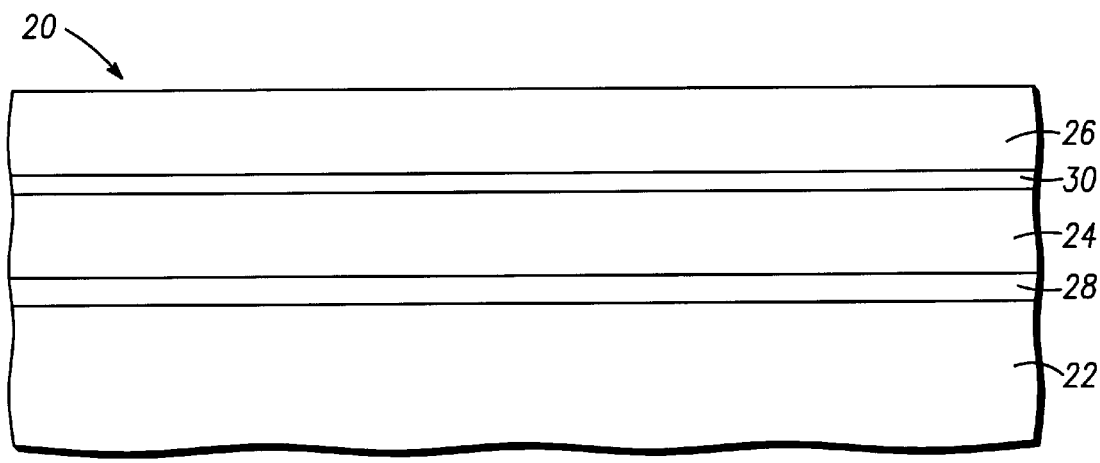
FIGS. 1–2 illustrate schematically, in cross section, device structures in accordance with various embodiments of the invention.

FIG. 1 illustrates schematically, in cross section, a portion of a microelectronic structure 20 in accordance with an embodiment of the invention. Microelectronic structure 20 includes a monocrystalline substrate 22, accommodating buffer layer 24 comprising a monocrystalline material, and a layer 26 of a monocrystalline conductive oxide material. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and monocrystalline oxide layer 26. As will be explained more fully below, the template layer helps to initiate the growth of the conductive oxide layer on the accommodating buffer layer. The amorphous intermediate layer helps to relieve the strain in the accommodating buffer layer and, by doing so, aids in the growth of a high crystalline quality accommodating buffer layer.

Substrate 22, in accordance with an embodiment of the invention, is a monocrystalline semiconductor wafer, preferably of large diameter. The wafer can be of a material from Group IV of the periodic table, and preferably a material from Group IVA. Examples of Group IV semiconductor materials include silicon, germanium, mixed silicon and germanium, mixed silicon and carbon, mixed silicon, germanium and carbon, and the like. Substrate 22 can also be of a compound semiconductor material. The compound semiconductor material of substrate 22 can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like.

Preferably, substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline conductive oxide layer 26.

Accommodating buffer layer 24 is preferably a monocrystalline oxide or nitride material selected for its crystalline compatibility with the underlying substrate and with the overlying conductive oxide material. For example, the material could be an oxide or nitride having a lattice structure closely matched to the substrate and to the subsequently applied conductive oxide material. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements and have a perovskite crystalline structure. In some specific applications, the metal oxides or nitride may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The conductive oxide material of layer 26 can be selected, as desired for a particular structure or application. For example, layer 26 can include perovskite materials such as (La, Sr)CoO$_3$, SrRuO$_3$, SrVO$_3$, BaRuO$_3$, BaVO$_3$ and (La, Ca)MnO$_3$, having a thickness in the range of about 2 to 200 nm.

Suitable template materials chemically bond to the surface of the accommodating buffer layer 24 at selected sites and provide sites for the nucleation of the epitaxial growth of the subsequent conductive oxide layer 26. When used, template layer 30 has a thickness ranging from about 1 to about 10 monolayers.

Figure 2:
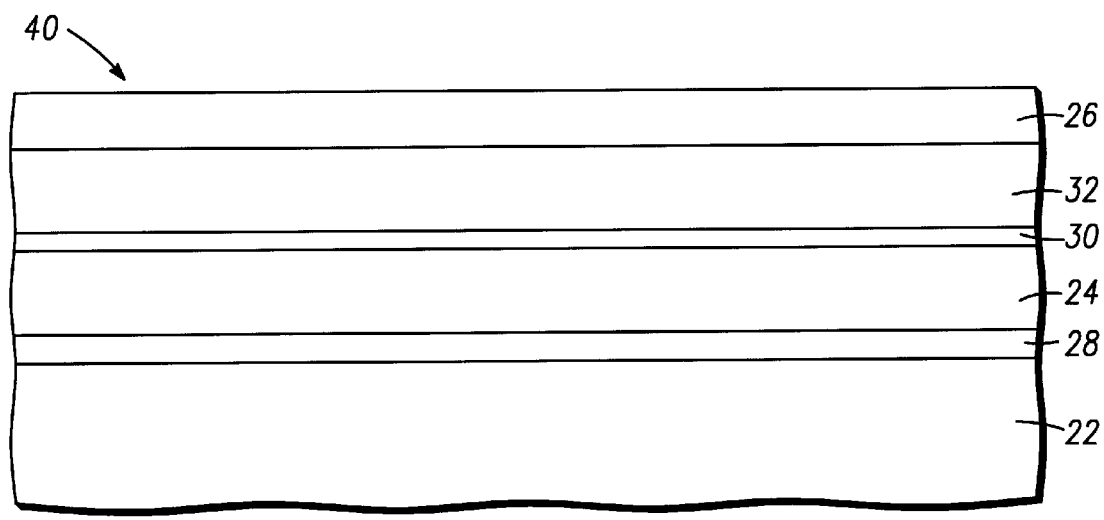

FIG. 2 illustrates, in cross section, a portion of a microelectronic structure 40 in accordance with a further embodiment of the invention. Structure 40 is similar to the previously described semiconductor structure 20, except that an additional buffer layer 32 is positioned between accommodating buffer layer 24 and layer of monocrystalline layer 26. Specifically, the additional buffer layer is positioned between template layer 30 and the overlying layer 26. The additional buffer layer serves to provide a lattice compensation when the lattice constant of the accommodating buffer layer cannot be adequately matched to the overlying monocrystalline layer. The additional buffer layer 32 also serves as thermal insulator, blocking heat that may adversely affect an integrated circuit (described below) formed in substrate 22.

The following non-limiting, illustrative examples illustrate various combinations of materials useful in structures 20 and 40 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of Sr$_z$Ba$_{1-z}$TiO$_3$ where z ranges from 0 to 1 and the amorphous intermediate layer is a layer of silicon oxide (SiO$_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (nm) and preferably has a thickness of about 5 nm. In general, it is desired to have an accommodating buffer layer thick enough to isolate the conductive layer from the substrate to obtain the desired properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1 to 2 nm.

In accordance with this embodiment of the invention, conductive material layer 26 is a layer of $(La,Sr)CoO_3$ having a thickness of about 2 to about 200 nm and preferably a thickness of about 10 to about 100 nm. The thickness generally depends on the application for which the layer is being prepared. To facilitate the epitaxial growth of the $(La,Sr)CoO_3$ on the monocrystalline oxide, a template layer is formed by capping the oxide layer.

EXAMPLE 2

In accordance with another embodiment of the invention, a structure is provided that is suitable for the growth of an epitaxial film of pyroelectric material overlying a conductive material as illustrated in FIG. 2. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. The conducting oxide can be $(La, Sr)CoO_3$, having a thickness of about 2 to about 200 nm and preferably a thickness of about 10 to about 100 nm. A template layer to facilitate growth of an additional layer of monocrystalline material may be formed. The additional layer of monocrystalline material can be $SrTiO_3$ having a thickness of 2 to 200 nm and preferably a thickness of about 10 to 100 nm. A layer of pyroelectric material may be deposited overlying the conducting oxide layer and may include $Pb(Ti, Zr)O_3$, having a thickness of about 2 to about 200 nm and preferably a thickness of about 100 to about 1000 nm.

Referring again to FIGS. 1–2, substrate 22 is a monocrystalline substrate such as a monocrystalline silicon substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 3:
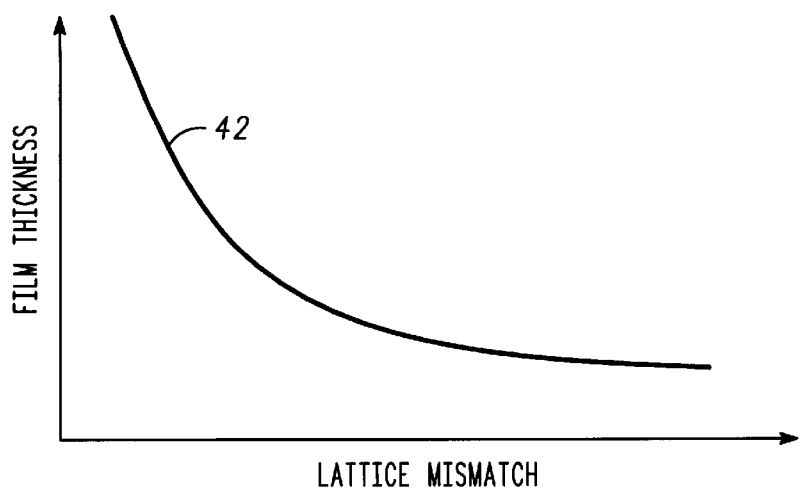
FIG. 3 illustrates graphically the relationship between maximum attainable film thickness and lattice mismatch between a host crystal and a grown crystalline overlayer.

FIG. 3 graphically illustrates the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that tend to be polycrystalline. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–2, layer 26 is a layer of epitaxially grown conductive oxide material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials, this substantial matching of lattice constants is achieved as a result of rotation of the crystal orientation of the grown crystal with respect to the orientation of the host crystal. In some instances, a crystalline buffer layer between the host oxide and the grown conductive oxide layer can be used to reduce strain in the grown monocrystalline conductive oxide layer that might result from small differences in lattice constants. Better crystalline quality in the grown monocrystalline conductive oxide layer can thereby be achieved.

The following example illustrates a process, in accordance with one embodiment of the invention, for fabricating a microelectronic structure such as the structures depicted in FIGS. 1–2. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 4° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkali earth metals or combinations of alkali earth metals in an MBE apparatus. In the case where strontium is used, the substrate is then heated to a temperature of about 850° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkali earth metal oxide, such as strontium oxide, strontium barium oxide, or barium oxide, onto the substrate surface by MBE at a low temperature and by subsequently heating the structure to a temperature of about 850° C. At this temperature, a solid state reaction takes place between the strontium oxide and the native silicon oxide, causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered monocrystal with the crystalline orientation rotated by 45° with respect to the ordered 2×1 crystalline structure of the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate may be capped by a template layer that is conducive to the subsequent growth of an epitaxial layer of a desired conductive oxide material. For example, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of the template (if one is formed), the conductive oxide material is grown using MBE or other suitable techniques.

The process described above illustrates a process for forming a semiconductor structure including a silicon substrate, an overlying oxide layer, and a monocrystalline conductive oxide layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, perovskite oxides such as alkaline earth metal tin-based perovskites, lanthanum aluminate, lanthanum scandium oxide, and gadolinium oxide can also be grown. Further, by a similar process such as MBE, other conductive oxide layers can be deposited overlying the monocrystalline oxide accommodating buffer layer.

Each of the variations of conductive oxide layers, pyroelectric layers, and monocrystalline oxide accommodating buffer layers may use an appropriate template for initiating the growth of the respective layer. In such a case, suitable template materials may be grown according to the methods described above in connection with growing layer 26.

Figure 4:
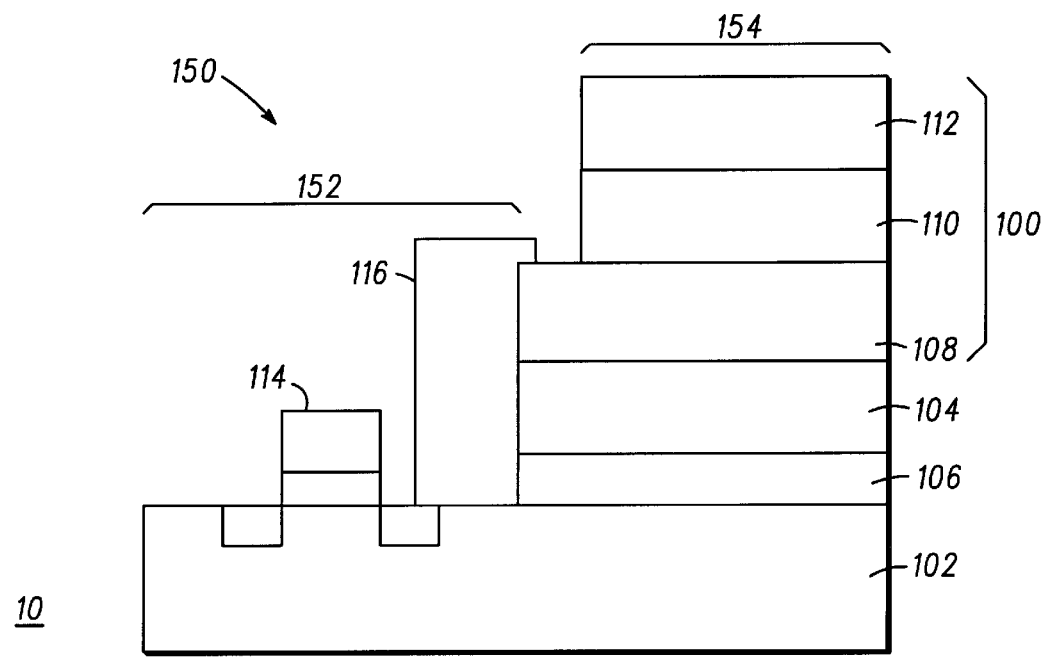
FIG. 4 illustrates schematically, in cross-section, an exemplary embodiment of a pyroelectric detector fabricated on a semiconductor substrate according to the present invention.

FIG. 4 illustrates a device structure 150 in accordance with a further embodiment of the present invention. Structure 150 includes a first region 152 in which an electrical component 114 is formed within a substrate 102 and a second region 154 in which a pyroelectric element 100 is formed using a pyroelectric layer 110. To fabricate pyroelectric element 100, a monocrystalline substrate 102 such as silicon functions as the starting material. A monocrystalline perovskite accommodating buffer layer 104 is then grown epitaxially over substrate 102 and an amorphous intermediate layer 106 may be formed between substrate 102 and layer 104 by the oxidation of substrate 102 during the growth of layer 104. Element 100 is similar to structure 20, except that a template layer is not illustrated in FIG. 4. Nevertheless, element 100 may include a template layer between any adjacent monocrystalline layers as described herein. In a preferred embodiment, substrate 102 is a silicon substrate, and layer 104 is an insulative oxide layer of perovskite, as discussed above in connection with layer 24, illustrated in FIGS. 1–2 above. In a particularly preferred embodiment, layer 104 may be formed from material from the group which includes, but is not limited to, $BaTiO_3$, $SrTiO_3$, and $CaTiO_3$ and may have a thickness in the range of about 2–100 nm.

Next, a monocrystalline perovskite-conducting layer 108 is epitaxially deposited over accommodating buffer layer 104. Conducting layer 108 behaves as either a metallic conductor or a semiconductor. In a preferred embodiment, conducting layer 108 is a monocrystalline perovskite oxide material. Exemplary materials suitable for forming conducting layer 108 include, but are not limited to, $(La, Sr)CoO_3$, $SrRuO_3$, $SrVO_3$, $BaRuO_3$, $BaVO_3$, and $(La, Ca)MnO_3$. Conducting layer 108 preferably exhibits a thickness in the range of about 2 nm to 200 nm.

A pyroelectric layer 110 is deposited on conducting layer 108. Exemplary pyroelectric materials suitable for pyroelectric layer 110 include perovskite metallic oxides such as $Pb(Ti, Zr)O_3$, $PbTiO_3$, $BaTiO_3$, $Pb(Sc, Ta)O_3$, $Bi(Ti, Zr)_3O_{12}$, $SrBi_2(Ta, Nb)_2O_9$, and $YMnO_3$. Pyroelectric layer 110 preferably exhibits a thickness in the range of about 2 to 200 nm.

An electrode layer 112 is formed overlying pyroelectric layer 110. Electrode layer 112 can be formed of any suitable conductive material such as Ni, Cr, Pt, Ir, Ti and the like and preferably absorbs infrared radiation of a wavelength in the range of about 8 μm to 12 μm. Alternatively, electrode layer 112 may also be formed of a monocrystalline perovskite conducting oxide, such as those materials used to form conducting layer 108, for example, (La, Sr)CoO$_3$.

Pyroelectric element 100 is coupled to a CMOS device 114 via a suitable interconnect 116 to form a pyroelectric imaging device, such as those used for motion detection or thermal imaging. CMOS device 114 may comprise a device such as a MOSFET which is formed by conventional semiconductor processing as is well known and widely practiced in the semiconductor industry. To enhance contact between pyroelectric device 100 and CMOS device 114, a metal layer (not shown) may be deposited overlying conducting layer 108 before pyroelectric layer 110 is deposited thereon. A plurality of pyroelectric imaging devices which detect the same or different wavelengths of infrared radiation may then be combined in an array which produces an image corresponding to the received infrared radiation.

To reduce the thermal capacity and thermal conduction into substrate 102, a portion of substrate 102 is preferably removed proximate pyroelectric element 100. In accordance with one embodiment of the invention, the portion of substrate 102 is removed using an etch which selectively etches material of substrate 102 relative to material comprising layer 104, that is, layer 104 may serve as an etch-stop. In another alternative embodiment of the invention, if layer 104 is formed sufficiently thick, it may serve as a thermal insulating layer, thereby thermally isolating substrate 102 from the pyroelectric layer 110 and reducing the thermal conduction of substrate 102. Accordingly, it may not be necessary to remove a portion of substrate 102 proximate pyroelectric element 100. Similarly, in yet another alternative embodiment, a thermal insulation layer such as BaTiO$_3$, SrTiO$_3$ and CaTiO$_3$ may be epitaxially grown on accommodating buffer layer 104 before the formation of conduction layer 108. The thermal insulation layer would serve to thermally insulate substrate 102, thereby rendering the selective etching of substrate 102 proximate to the pyroelectric device unnecessary.

It should be noted that the steps of epitaxially growing or depositing the various layers includes epitaxially growing or depositing layers by processes such as MBE, MOCVD, MEE, CVD, PVD, CSD and ALE as previously indicated with respect to the processing steps described above for fabricating the structures shown in FIGS. 1–3.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, solution to occur or become more pronounced are not to be constructed as critical, required, or essential features or elements of any or all of the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A pyroelectric detector circuit comprising:
   a monocrystalline silicon substrate;
   a portion of a MOS circuit formed in the monocrystalline silicon substrate;
   a first monocrystalline perovskite layer formed of material selected from the group comprising BaTiO$_3$, SrTiO$_3$, and CaTiO$_3$ and epitaxially grown overlying the silicon substrate;
   a second monocrystalline perovskite layer formed of material selected from the group comprising (La, Sr)CoO$_3$, SrRuO$_3$, SrVO$_3$, BaRuO$_3$, BaVO$_3$ and (La, Ca)MnO$_3$ overlying the first monocrystalline pyroelectric layer;
   a monocrystalline pyroelectric layer formed of perovskite material from the group comprising Pb(Ti, Zr)O$_3$, PbTiO$_3$, BaTiO$_3$, Pb(Sc, Ta)O$_3$, Bi(Ti, Zr)$_3$O$_{12}$, SrBi$_2$(Ta, Nb)$_2$O$_9$ and YMnO$_3$; and
   an electrical connection electrically coupling the portion of a MOS circuit and the second monocrystalline perovskite layer.

2. The pyroelectric detector circuit of claim 1, further comprising a metal layer overlying the monocrystalline pyroelectric layer.

3. The pyroelectric detector circuit of claim 1, further comprising a third monocrystalline perovskite layer overlying the monocrystalline pyroelectric layer.

4. The pyroelectric detector circuit of claim 1, further comprising an amorphous layer of silicon oxide overlying the monocrystalline silicon substrate.

5. The pyroelectric detector circuit of claim 2, wherein the metal layer is formed from material selected from the group comprising Ni, Cr, Pt, Sr, and Ti.

6. The pyroelectric detector circuit of claim 3, wherein the third monocrystalline perovskite layer is formed of material selected from the group comprising (La,Sr)CoO$_3$, SrRuO$_3$, SrVO$_3$, BaRuO$_3$, BaVO$_3$, and (La,Ca)MnO$_3$.

* * * * *